(12) United States Patent
Kim et al.

(10) Patent No.: US 9,214,244 B2
(45) Date of Patent: Dec. 15, 2015

(54) METHOD OF READING DATA STORED IN FUSE DEVICE AND APPARATUSES USING THE SAME

(71) Applicant: Samsung Electronics Co., Ltd., Suwon-si (KR)

(72) Inventors: Gil Su Kim, Hwaseong-si (KR); Jong Min Oh, Seoul (KR); Sung Min Seo, Seoul (KR); Seong Jin Jang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 353 days.

(21) Appl. No.: 13/798,679

(22) Filed: Mar. 13, 2013

(65) Prior Publication Data

US 2013/0265815 A1    Oct. 10, 2013

(30) Foreign Application Priority Data

Apr. 6, 2012  (KR) .................. 10-2012-0036055

(51) Int. Cl.
| | | |
|---|---|---|
| G11C 17/18 | (2006.01) | |
| G11C 17/16 | (2006.01) | |
| G11C 7/20 | (2006.01) | |
| G11C 29/00 | (2006.01) | |

(52) U.S. Cl.
CPC .......... *G11C 17/16* (2013.01); *G11C 7/20* (2013.01); *G11C 17/18* (2013.01); *G11C 29/789* (2013.01)

(58) Field of Classification Search
USPC ..................................... 365/96, 230.06, 203
See application file for complete search history.

(56) References Cited

U.S. PATENT DOCUMENTS

| | | | |
|---|---|---|---|
| 7,277,349 B2 | 10/2007 | Pan et al. | |
| 2003/0218921 A1* | 11/2003 | Schrogmeier et al. | 365/200 |
| 2006/0245259 A1* | 11/2006 | Fukuda et al. | 365/185.22 |
| 2007/0033449 A1* | 2/2007 | Hwang et al. | 714/710 |
| 2007/0058473 A1 | 3/2007 | Kouchi et al. | |
| 2008/0212388 A1* | 9/2008 | Hoefler | 365/225.7 |
| 2010/0165699 A1 | 7/2010 | Chen et al. | |
| 2010/0220511 A1 | 9/2010 | Kurjanowicz | |
| 2011/0128810 A1* | 6/2011 | Sato | 365/230.06 |
| 2011/0292708 A1* | 12/2011 | Kang et al. | 365/63 |

* cited by examiner

*Primary Examiner* — Huan Hoang
*Assistant Examiner* — Minh Dinh
(74) *Attorney, Agent, or Firm* — Muir Patent Law, PLLC

(57) ABSTRACT

A method for reading data stored in a fuse device included in a memory device including a memory cell array is provided. The method comprises reading trimming data of the fuse device, wherein the trimming data is related to trimming a level of voltage or a level of current used for an operation of the memory device; and after the reading the trimming data, reading defective cell address data of the fuse device, wherein the defective cell address data is related to defective cells in the memory cell array.

13 Claims, 22 Drawing Sheets

US 9,214,244 B2

METHOD OF READING DATA STORED IN FUSE DEVICE AND APPARATUSES USING THE SAME

CROSS-REFERENCE TO RELATED APPLICATIONS

This application claims priority under 35 U.S.C. §119(a) to Korean Patent Application No. 10-2012-0036055 filed on Apr. 6, 2012, the disclosure of which is hereby incorporated by reference in its entirety.

BACKGROUND

Various example embodiments relate to a fuse device, and more particularly, to a method of reading data stored in a fuse device in a predetermined order and apparatuses using the same.

One-time programmable (OTP) memory may be used in a micro controller unit (MCU), a power management integrated circuit (PMIC), a display driver IC (DDI), and a complementary metal oxide semiconductor (CMOS) image sensor.

OTP memory can be programmed by breaking the connection of a fuse or creating the connection of an anti-fuse in its circuit. In general, once programming is performed in the OTP memory, the programming is irreversible. Accordingly, programming of the OTP memory is carried out taking the final purpose of the programming into consideration after the OTP memory is manufactured.

A resistive fuse element that can be implemented in OTP memory may be opened or shorted by a current of at least a predetermined value. An anti-fuse that can be used in the OTP memory may be implemented by a thin layer including a non-conducting material, e.g., silicon dioxide, between two conductors. The two conductors may be shorted or become an electrically conductive path with a low resistance by a current of at least a predetermined value.

When OTP memory is included in a semiconductor memory device, the OTP memory may store various types of data used for the operation of the semiconductor memory device. The OTP memory may be implemented in a form of an array including a plurality of fuses or anti-fuses in order to efficiently store the data.

SUMMARY

According to some embodiments, there is provided a method for reading data stored in a fuse device included in a memory device including a memory cell array. The method includes reading trimming data of the fuse device, the trimming data is related to trimming of a level of voltage or a level of current used for an operation of the memory device; and after the reading the trimming data, reading defective cell address data of the fuse device, the defective cell address data is related to defective cells in the memory cell array.

According to other embodiments of the inventive concept, there is provided a fuse device including a controller configured to sequentially generate a first read command set and a second read command set; a first access circuit configured to read trimming data, which is related with trimming of voltage or current used for an operation of the memory device, in response to the first read command set; and reading defective cell address data, which is related with defective cells in a memory cell array included in the memory device, in response to the second read command set after the trimming data is read another method for reading data stored in a fuse cell array of a memory device including a memory cell array. The method includes reading a first data of the fuse cell array, the first data includes trimming information of level of voltage or level of current used for an operation of the memory device; reading a second data of the fuse call array, the second data includes mode register set (MRS) information for setting of a mode register included in the memory device; and reading a third data of the fuse cell array, the third data includes defective address information that indicates one or more defective cells of the memory cell array. The reading the first data is performed before reading the second data or reading the third data is performed.

According to further embodiments, there is provided a fuse device of a memory device including a memory cell array. The fuse device includes a controller configured to generate a first command set and a subsequent second command set; a first access circuit configured to read trimming data including trimming level information of voltage or trimming level information of current used for an operation of the memory device in response to the first command set; and a second access circuit configured to read defective cell address data including address information of a defective cell in the memory cell array in response to the second command set. The second access circuit is configured to read the defective cell address data after reading of the trimming data by the first access circuit.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
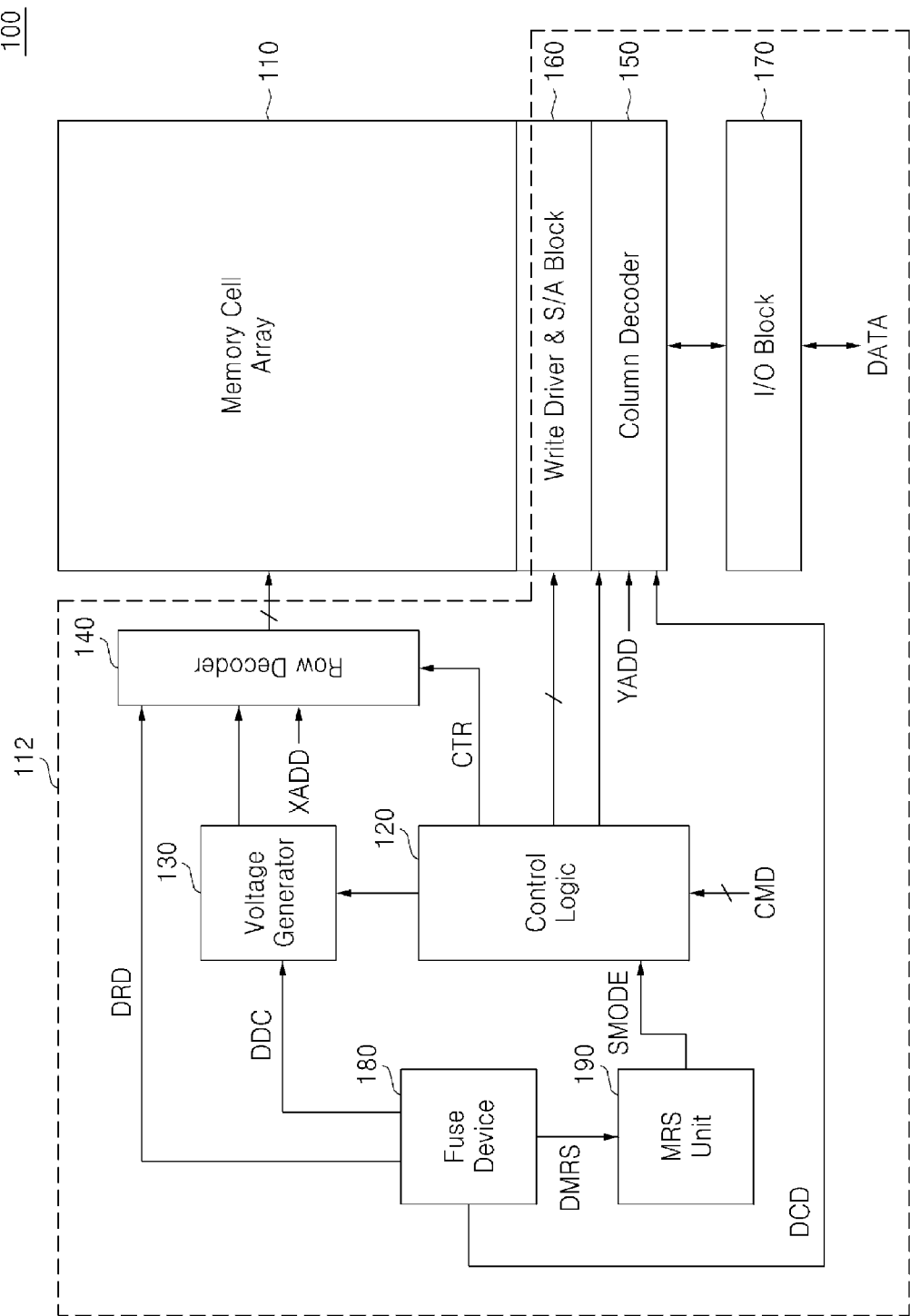
FIG. 1 is a block diagram of an exemplary memory device according to some embodiments.

Various example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

Example embodiments relate to a semiconductor device and a method of operating the same, and more particularly, to a semiconductor device capable of quickly and stably reading data from a memory cell by increasing a difference between levels of a bit line and a complementary bit line during a precharge operation when a power supply voltage is low, and a method of operating the semiconductor device.

FIG. 1 is a block diagram of a memory device 100 according to some embodiments. The memory device 100 includes a memory cell array 110 and an access control circuit 112.

The memory device 100 may be implemented by a volatile or non-volatile memory device. The volatile memory device may include dynamic random access memory (DRAM), static RAM (SRAM), thyristor RAM (T-RAM), zero capacitor RAM (Z-RAM), or twin transistor RAM (TTRAM).

The non-volatile memory device may include electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, or insulator resistance change memory.

The memory cell array 110 may include a plurality of memory cells storing data. The memory cell array 110 may be implemented in a two- or three-dimensional structure.

The access control circuit 112 may access the memory cell array 110 to perform a data access operation, e.g., a read operation, according to a set of commands CMD, XADD, and YADD received from an external device, e.g., a memory controller (not shown). In one embodiment, the access control circuit 112 may access the memory cell array 110 to perform a program operation (or a write operation), or an erase operation.

The access control circuit 112 includes a control logic 120, a voltage generator 130, a row decoder 140, a column decoder 150, a write driver and sense amplifier (S/A) block 160, an input/output (I/O) block 170, a fuse device 180, and a mode register set (MRS) unit 190. Each of these elements may be implemented using various circuit elements and thus each of control logic 120, voltage generator 130 . . . , comprises a circuit.

The control logic 120 may control the overall operation of the access control circuit 112 in response to a command (e.g., CMD) included in a command set. The voltage generator 130 may generate a voltage used for the data access operation according to a control code generated by the control logic 120. Although the voltage generated by the voltage generator 130 is applied to the row decoder 140 in FIG. 1 for convenience' sake in the description, the disclosure is not restricted thereto.

The row decoder 140 may decode the row address XADD according to a control signal CTR received from the control logic 120. The column decoder 150 may decode the column address YADD under the control of the control logic 120.

The write driver and S/A block 160 may function as a sense amplifier that can sense and amplify a voltage level of each of a plurality of bit lines included in the memory cell array 110 according to the control of the control logic 120 when the memory device 100 performs the read operation. The write driver and S/A block 160 may function as a write driver that can drive each of the bit lines included in the memory cell array 110 according to the control of the control logic 120 when the memory device 100 performs the write operation.

The I/O block 170 may transmit data received from an external device to the column decoder 150 and transmit data output from the column decoder 150 to a device outside the memory device 100, e.g., the memory controller (not shown). The fuse device 180 may store trimming data DDC related to the trimming of a level of voltage or a level of current used for the operation of the memory device 100.

For convenience' sake in the description, the fuse device 180 is described, but the present disclosure may be applied to an anti-fuse device as well.

The trimming data DDC may include information about the level of voltage or current used when the voltage generator 130 trims a voltage or a current.

The fuse device 180 may store defective cell address data related to defective cells in the memory device 100. For instance, the fuse device 180 may store row data DRD including a row address of the defective cells or column data DCD including a column address of the defective cells.

The fuse device 180 may store MRS data DMRS related to the setting of the MRS unit 190. The MRS data DMRS may include information, e.g., an operating frequency and/or a direct current (DC) voltage level, used for the operation of the memory device 100 according to the operation mode of the memory device 100.

The trimming data DDC read from the fuse device 180 may be transmitted to the voltage generator 130. The voltage generator 130 may generate a voltage based on the trimming data DDC. The row data DRD read from the fuse device 180 may be transmitted to the row decoder 140. The row decoder 140 may decode the row address XADD based on the row data DRD.

When the row address XADD is the same as the row address of a defective cell, the row decoder 140 may remap the row address XADD to a row address of a redundancy cell corresponding to the defective cell.

The column data DCD read from the fuse device 180 may be transmitted to the column decoder 150. The column decoder 150 may decode the column address YADD based on the column data DCD.

When the column address YADD is the same as the column address of a defective cell, the column decoder 150 may remap the column address YADD to a column address of a redundancy cell corresponding to the defective cell.

The MRS data DMRS read from the fuse device 180 may be transmitted to the MRS unit 190.

The structure and the operations of the fuse device 180 will be described in detail with reference to FIGS. 2 and 9.

The MRS unit 190 may include a mode register (not shown). The MRS unit 190 may set a mode register (not shown) included in the MRS unit 190 based on the MRS data DMRS read from the fuse device 180. The MRS unit 190 may send a mode signal SMODE to the control logic 120. The control logic 120 may control the overall operation of the memory device 100 based on the mode signal SMODE.

Figure 2:
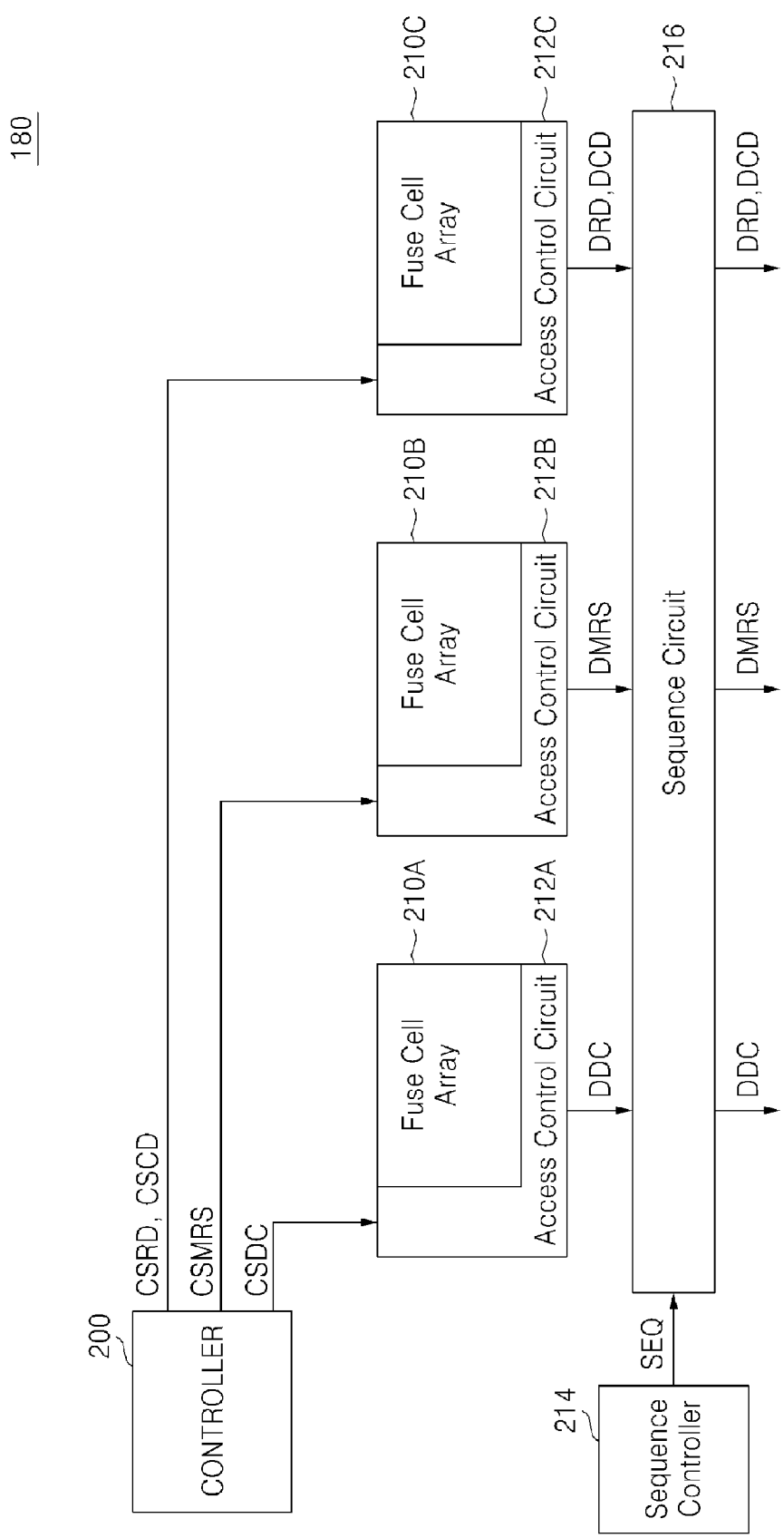
FIG. 2 is a block diagram of an exemplary fuse device illustrated in FIG. 1 according to some embodiments.

FIG. 2 is a block diagram of the fuse device 180 illustrated in FIG. 1 according to some embodiments. Referring to FIGS. 1 and 2, the fuse device 180 includes a controller 200, a plurality of fuse cell arrays 210A, 210B, and 210C, and a plurality of access control circuits 212A, 212B, and 212C. The fuse device 180 may also include a sequence controller 214 and a sequence circuit 216.

The controller 200 may output a plurality of command sets CSDC, CSMRS, CSRD, and CSCD. Each of the command sets CSDC, CSMRS, CSRD, and CSCD may refer to a signal including a command and/or an address.

The controller 200 may sequentially send the command sets CSDC, CSMRS, CSRD, and CSCD to the access control circuits 212A, 212B, and 212C. The transmission timing of the command sets CSDC, CSMRS, CSRD, and CSCD will be described in detail with reference to FIGS. 3 through 5 later.

The fuse cell arrays 210A, 210B, and 210C may include a plurality of fuses or anti-fuses to store data.

The fuse cell array 210A may store the trimming data DDC. The fuse cell array 210B may store the MRS data DMRS. The fuse cell array 210C may store the row data DRD and the column data DCD.

Although each of the trimming data DDC, the MRS data DMRS, the row data DRD, and the column data DCD is stored in a different fuse cell array 210A, 210B, or 210C in the embodiments illustrated in FIG. 2, the present disclosure is not restricted to the current embodiments. In one embodiment, the access control circuits 212A, 212B, and 212C may include a control logic (not shown), a voltage generator (not shown), a row decoder (not shown), a column decoder (not shown), and a write drive and S/A block (not shown).

The access control circuit 212A may output the trimming data DDC stored in the fuse cell array 210A in response to the command set CSDC received from the controller 200. The access control circuit 212B may output the MRS data DMRS stored in the fuse cell array 210B in response to the command set CSMRS received from the controller 200. The access control circuit 212C may output the row data DRD and the column data DCD stored in the fuse cell array 210C in response to the command sets CSRD and CSCD received from the controller 200.

For example, when the fuse device 180 does not include the sequence controller 214 and the sequence circuit 216, the data DDC, DMRS, DRD, or DCD output from the fuse cell array 210A, 210B, or 210C may be transmitted to the voltage generator 130, the MRS unit 190, the row decoder 140, or the column decoder 150.

The sequence controller 214 may generate a sequence signal SEQ determining transmission order of the DDC, DMRS, DRD, and DCD output from the access control circuits 212A, 212B, and 212C.

The sequence circuit 216 may transmit the data DDC, DMRS, DRD, or DCD to the voltage generator 130, the MRS unit 190, the row decoder 140, or the column decoder 150 in the transmission order based on the sequence signal SEQ.

The transmission order of the data DDC, DMRS, DRD, or DCD will be described in detail with reference to FIGS. 6 through 8.

Figure 3:
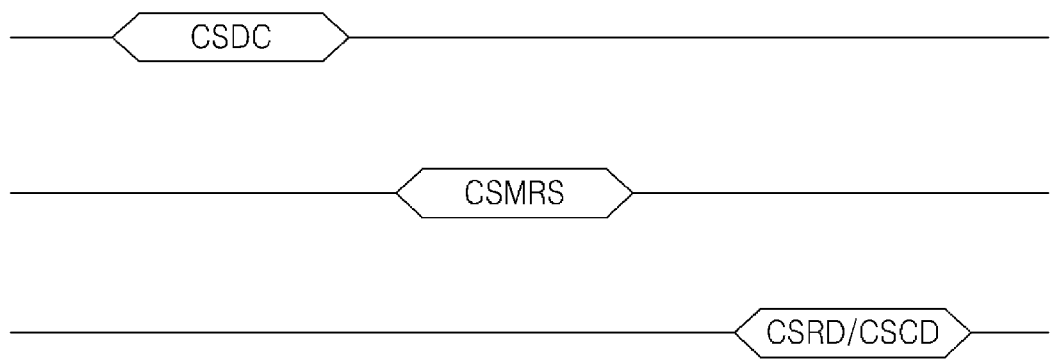
FIG. 3 is an exemplary timing diagram of a plurality of command sets transmitted from a controller illustrated in FIG. 2 according to some embodiments.
Figure 4:
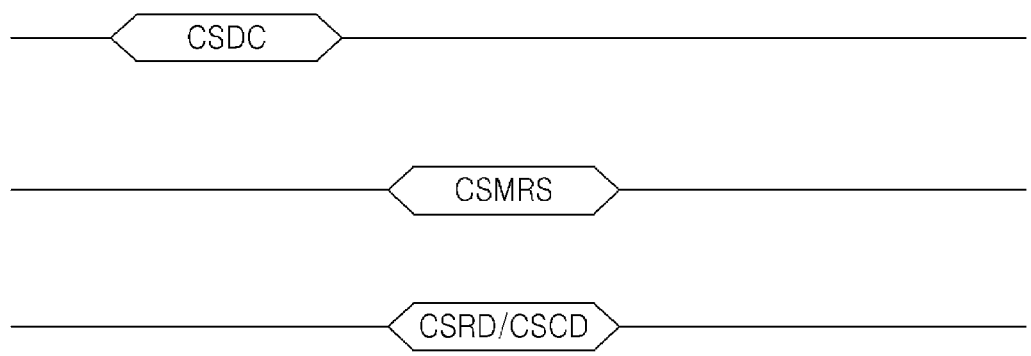
FIG. 4 is an exemplary timing diagram of a plurality of command sets transmitted from the controller illustrated in FIG. 2 according to other embodiments.
Figure 5:
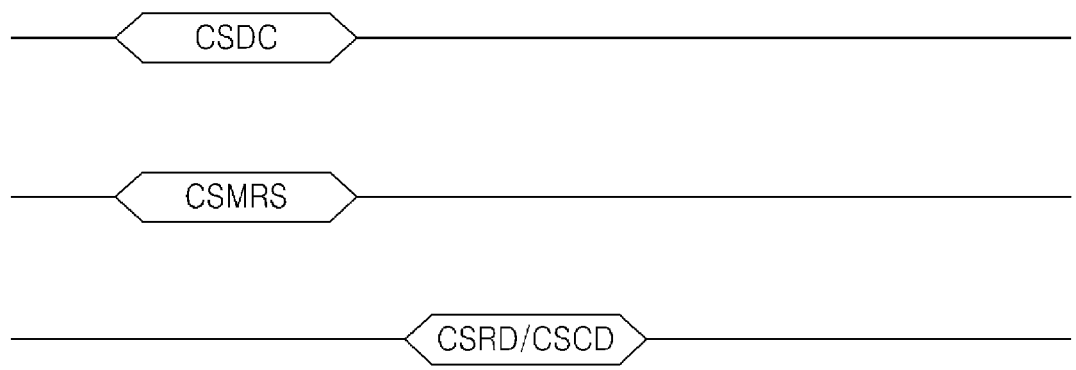
FIG. 5 is an exemplary timing diagram of a plurality of command sets transmitted from the controller illustrated in FIG. 2 according to further embodiments.

FIG. 3 is a timing diagram of a plurality of command sets transmitted from the controller 200 illustrated in FIG. 2 according to some embodiments. FIG. 4 is a timing diagram of a plurality of command sets transmitted from the controller 200 illustrated in FIG. 2 according to other embodiments. FIG. 5 is a timing diagram of a plurality of command sets transmitted from the controller 200 illustrated in FIG. 2 according to further embodiments.

Referring to FIGS. 2 through 5, the controller 200 may sequentially send the command set CSDC for reading the trimming data DDC, the command set CSMRS for reading the MRS data DMRS, and the command sets CSRD and CSCD for respectively reading defective cell address data DRD and DCD, as shown in FIG. 3.

As shown in FIG. 4, the controller 200 may send the command set CSMRS and the command sets CSRD and CSCD at the same time after sending the command set CSDC first. As shown in FIG. 5, the controller 200 may send the command set CSDC and the command set CSMRS at the same time and then send the command sets CSRD and CSCD.

Figure 6:
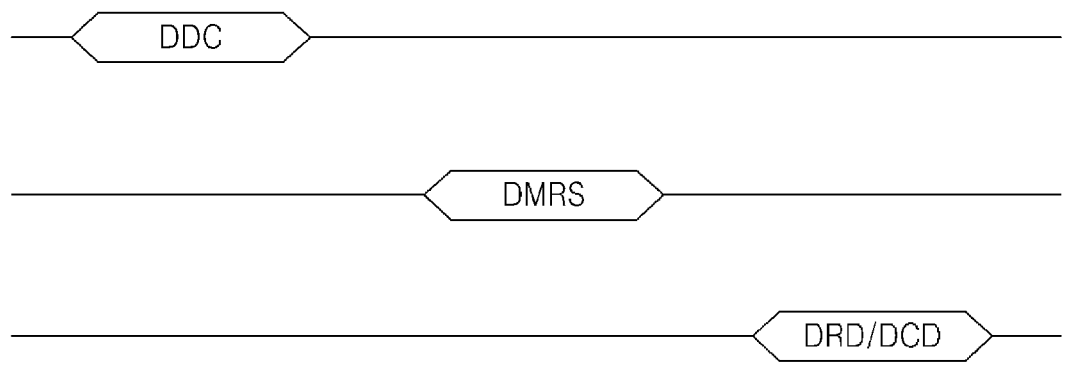
FIG. 6 is an exemplary timing diagram of a plurality of parallel data illustrated in FIG. 2 according to some embodiments.

FIG. 6 is a timing diagram of a plurality of parallel data illustrated in FIG. 2 according to some embodiments. FIG. 7 is a timing diagram of the plurality of parallel data illustrated in FIG. 2 according to other embodiments. FIG. 8 is a timing diagram of the plurality of parallel data illustrated in FIG. 2 according to further embodiments.

Referring to FIG. 2 and FIGS. 6 through 8, the trimming data DDC, the MRS data DMRS, and the defective cell address data DRD and DCD may be sequentially output from the access control circuits 212A, 212B, and 212C, respectively, as shown in FIG. 6. In one embodiment, the trimming data DDC, the MRS data DMRS, and the defective cell address data DRD and DCD may be sequentially output from the sequence circuit 216.

Figure 7:
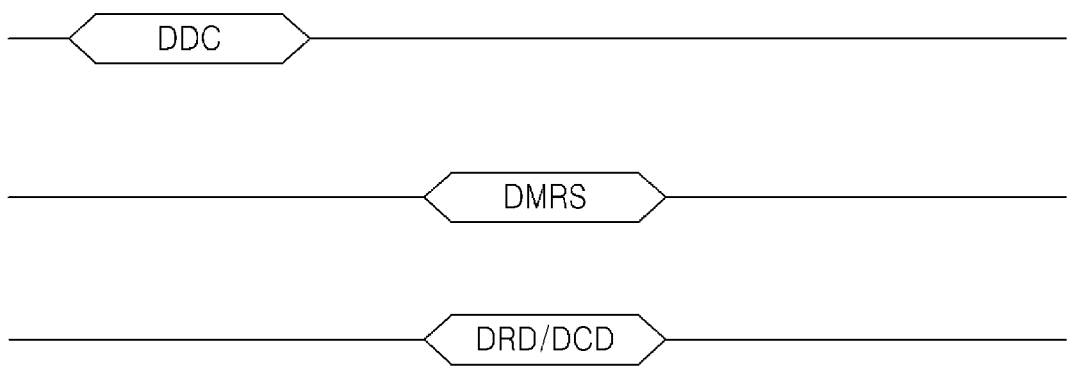
FIG. 7 is an exemplary timing diagram of the plurality of parallel data illustrated in FIG. 2 according to other embodiments.

As shown in FIG. 7, after the trimming data DDC is output from the access control circuit 212A, the MRS data DMRS and the defective cell address data DRD and DCD may be output from the access control circuits 212B and 212C, respectively, at the same time. In one embodiment, after the trimming data DDC is output from the sequence circuit 216, the MRS data DMRS and the defective cell address data DRD and DCD may be output from the sequence circuit 216 at the same time.

Figure 8:
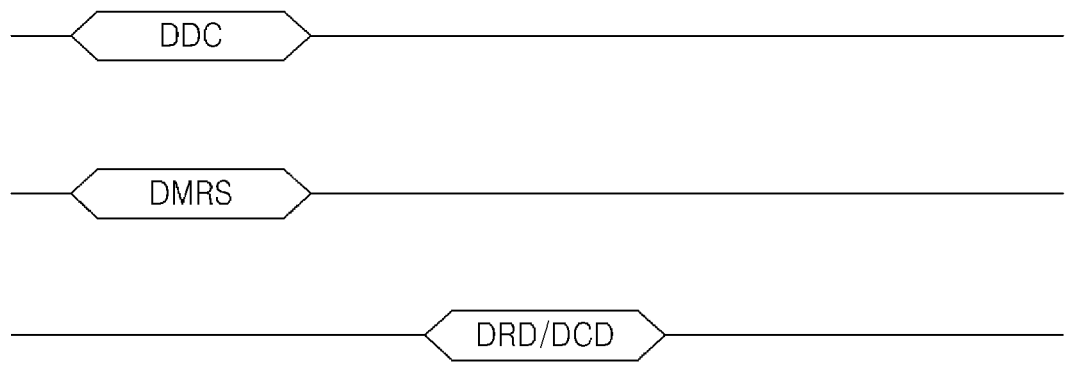
FIG. 8 is an exemplary timing diagram of the plurality of parallel data illustrated in FIG. 2 according to further embodiments.

As shown in FIG. 8, after the trimming data DDC and the MRS data DMRS are respectively output from the access control circuits 212A and 212B at the same time, the defective cell address data DRD and DCD may be output from the access control circuit 212C. In one embodiment, after the trimming data DDC and the MRS data DMRS are output from the sequence circuit 216 at the same time, the defective cell address data DRD and DCD may be output from the sequence circuit 216.

Figure 9:
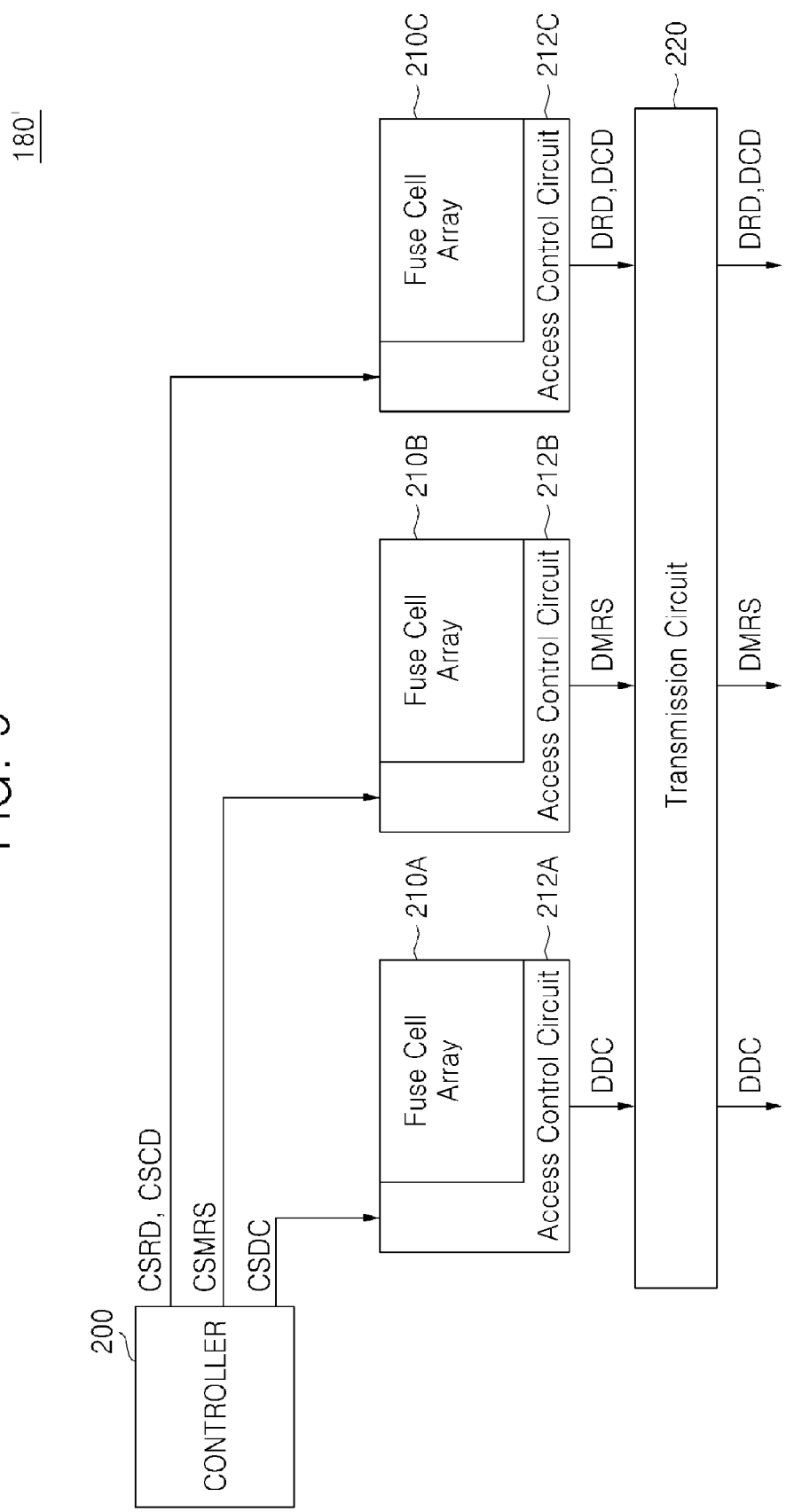
FIG. 9 is an exemplary block diagram of a fuse device illustrated in FIG. 1 according to other embodiments.

FIG. 9 is a block diagram of a fuse device 180' according to other embodiments. Referring to FIG. 9, the fuse device 180' includes the controller 200, the fuse cell arrays 210A, 210B, and 210C, the access control circuits 212A, 212B, and 212C, and a transmission circuit 220.

The transmission circuit 220 may serialize and deserialize the trimming data DDC, the MRS data DMRS, and the defective cell address data DRD and DCD and output them in a predetermined order. The transmission circuit 220 may transmit the trimming data DDC to the voltage generator 130, the MRS data DMRS to the MRS unit 190, the row data DRD to the row decoder 140, and the column data DCD to the column decoder 150.

The structure and the operations of the transmission circuit 220 will be described in detail with reference to FIG. 10.

Figure 10:
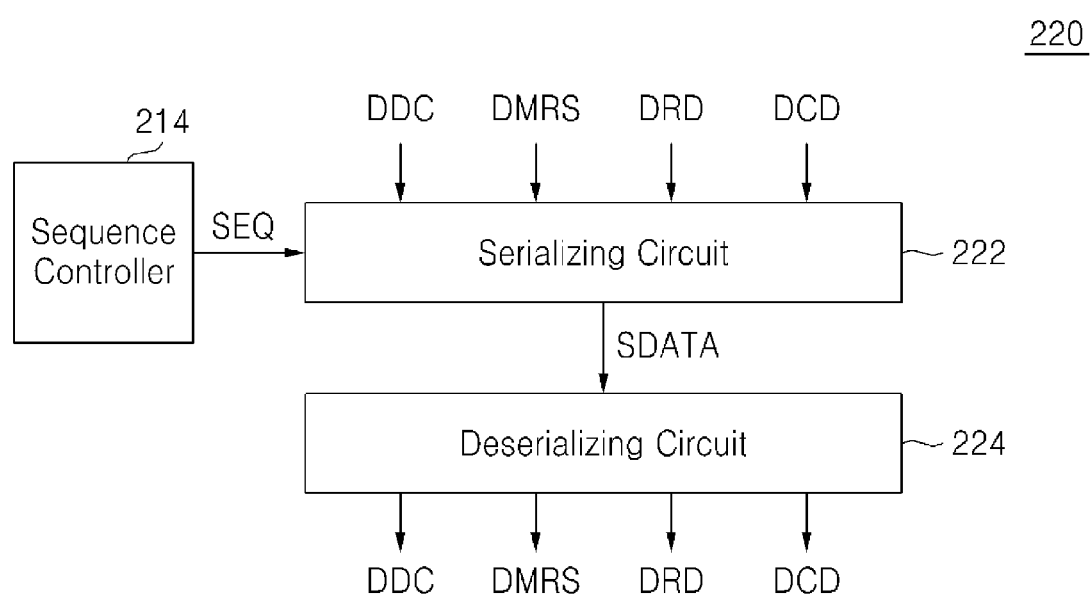
FIG. 10 is an exemplary block diagram of a transmission circuit illustrated in FIG. 9 according to some embodiments.
Figure 11:
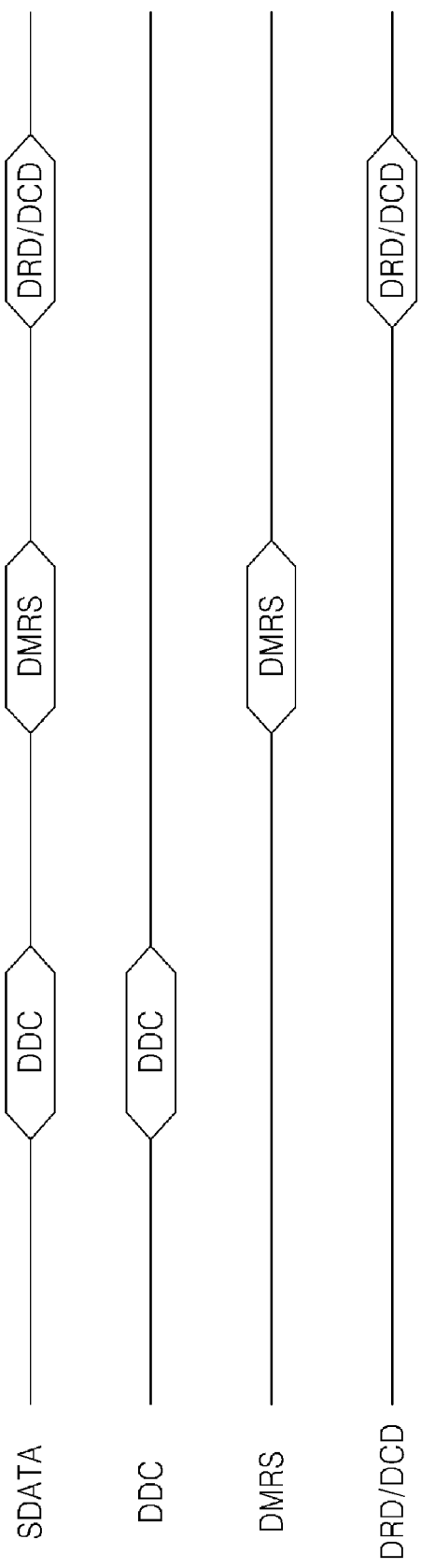
FIG. 11 is an exemplary timing diagram of serial data and a plurality of parallel data illustrated in FIG. 10 according to some embodiments.

FIG. 10 is a block diagram of the transmission circuit 220 illustrated in FIG. 9 according to some embodiments. FIG. 11 is a timing diagram of serial data and a plurality of parallel data illustrated in FIG. 10 according to some embodiments. Referring to FIGS. 9 through 11, the transmission circuit 220 includes the sequence controller 214, a serializing circuit 222, and a deserializing circuit 224. The serializing circuit 222 may include a data buffer (not shown).

The serializing circuit 222 may serialize data, e.g., the trimming data DDC, the MRS data DMRS, the row data DRD, and the column data DCD, transmitted from the access control circuits 212A, 212B, and 212C according to the sequence signal SEQ received from the sequence controller 214 and output serial data SDATA. For instance, the serializing circuit 222 may serialize the trimming data DDC, the MRS data DMRS, the row data DRD, and the column data DCD in a predetermined order and output the serial data SDATA in order of the trimming data DDC, MRS data DMRS, the row data DRD, and the column data DCD.

The deserializing circuit 224 may deserialize the serial data SDATA received from the serializing circuit 222 and output parallel data, e.g., the trimming data DDC, the MRS data DMRS, the row data DRD, and/or the column data DCD in parallel. In other words, the trimming data DDC may be output from the transmission circuit 220 before the row data DRD and/or the column data DCD through the serializing and deserializing procedure.

Figure 12:
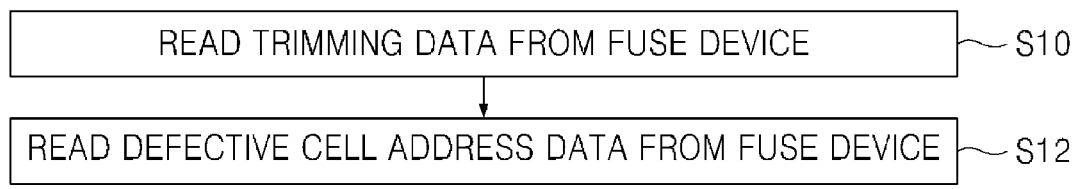
FIG. 12 is an exemplary flowchart of a method of reading data stored in a fuse device according to some embodiments.

FIG. 12 is a flowchart of a method of reading data stored in the fuse device 180 according to some embodiments. Referring to FIGS. 1, 2, 9, and 12, the memory device 100 may read the trimming data DDC from the fuse device 180 in operation S10. After reading the trimming data DDC, the memory device 100 may read defective cell address data, e.g., the row data DRD, and/or the column data DCD, from the fuse device 180 in operation S12.

Here, "reading data from" something, e.g., the fuse device 180, may signify the concept including an operation of reading the data DDC, DMRS, DRD, or DCD from the fuse cell array 210A, 210B, or 210C included in the fuse device 180 and outputting or transmitting the data DDC, DMRS, DRD, or DCD from the fuse device 180 to another circuit, e.g., the voltage generator 130, the MRS unit 190, the row decoder 140, or the column decoder 150.

Accordingly, when it is said that the defective cell address data DRD and DCD are read from the fuse device 180 after the trimming data DDC is read, it may mean that the defective cell address data DRD and DCD is output or transmitted from the fuse device 180 after the trimming data DDC is output or transmitted from the fuse device 180 regardless of the order in which the data DDC, DRD, or DCD is read from the fuse cell array 210A or 210C.

Alternatively, when it is said that the defective cell address data DRD and DCD are read from the fuse device 180 after the trimming data DDC is read, it may mean that the trimming data DDC is read from the fuse cell array 210A and then the defective cell address data DRD and DCD are read from the fuse cell array 210C.

Figure 13:
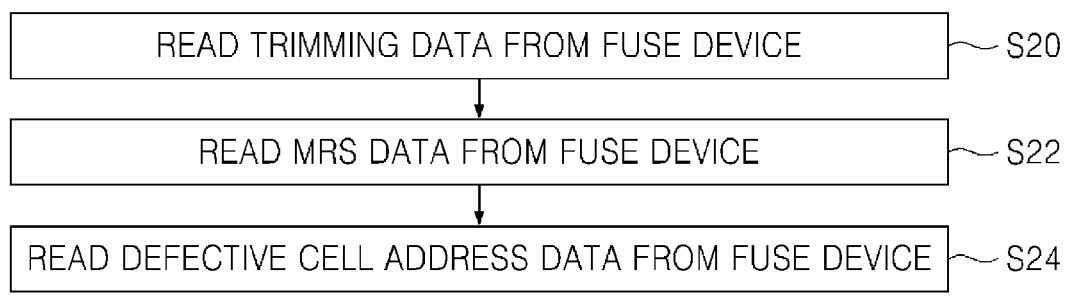
FIG. 13 is an exemplary flowchart of a method of reading data stored in a fuse device according to other embodiments.

FIG. 13 is a flowchart of a method of reading data stored in the fuse device 180 according to other embodiments. Referring to FIGS. 1 and 13, the memory device 100 may read the trimming data DDC from the fuse device 180 in operation S20. The memory device 100 may read the MRS data DMRS from the fuse device 180 after reading the trimming data DDC or may read the MRS data DMRS from the fuse device 180 at the same timing as it reads the trimming data DDC in operation S22. The memory device 100 may read the defective cell address data, e.g., the row data DRD and/or the column data DCD from the fuse device 180 after reading the MRS data DMRS or may read the defective cell address data, e.g., the row data DRD and/or the column data DCD from the fuse device 180 at the same time as it reads the MRS data DMRS in operation S24.

Figure 14:
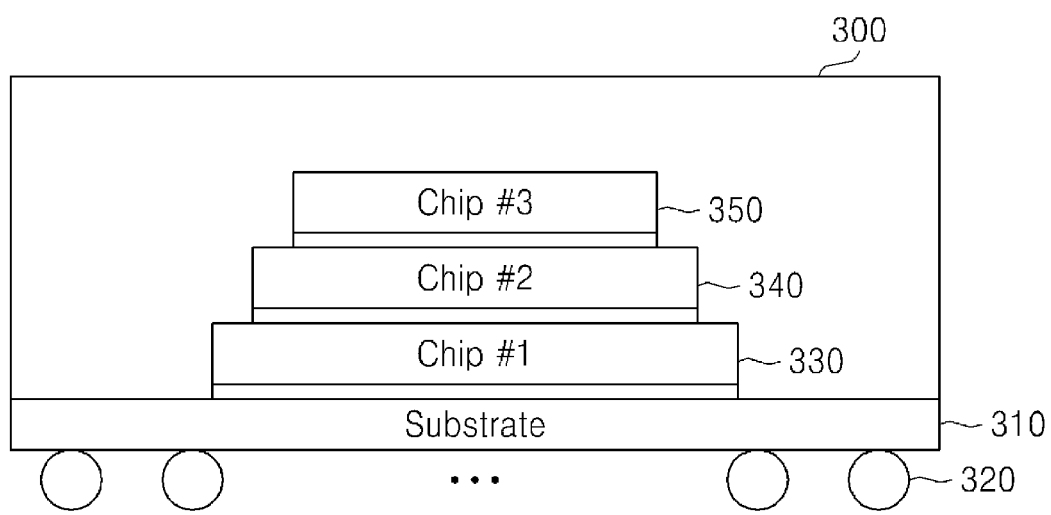
FIG. 14 is an exemplary conceptual diagram of a package including the memory device illustrated in FIG. 1 according to some embodiments.

FIG. 14 is a conceptual diagram of a package 300 including the memory device 100 illustrated in FIG. 1 according to some embodiments. Referring to FIGS. 1 and 14, the package 300 includes a plurality of semiconductor devices 330, 340, and 350 sequentially stacked on a package substrate 310. Each of the semiconductor devices 330 through 350 may be the memory device 100 disclosed above.

The package 300 may be a Package on Package (PoP), a Ball Grid Array (BGA), a Chip Scale Package (CSP), a Plastic Leaded Chip Carrier (PLCC), a Plastic Dual In-line Package (PDIP), a Chip On Board (COB), a CERamic Dual In-line Package (CERDIP), a plastic Metric Quad Flat Pack (MQFP), a Thin Quad Flat Pack (TQFP), a Small Outline Integrated Circuit (SOIC), a Shrink Small Outline Package (SSOP), a Thins Small Outline Package (TSOP), a System In Package (SIP), a Multi Chip Package (MCP), a Wafer-level Package (WLP), or a Wafer-level processed Stack Package (WSP).

A memory controller (not shown) may be implemented within at least one of the semiconductor devices 330 through 350 or may be implemented on the package substrate 310.

Electrical vertical connection means, e.g., a through-silicon via (TSV) or another through-substrate via, may be used to electrically connect the semiconductor devices 330 through 350 with one another.

The package 300 may be implemented as a hybrid memory cube (HMC) having a structure in which a memory controller and a memory cell array die are stacked. When the package 300 is implemented as the HMC, the performance of the memory device 100 is increased due to the increase of a bandwidth and the area of the memory device 100 is minimized. As a result, power consumption and manufacturing cost can be reduced.

Figure 15:
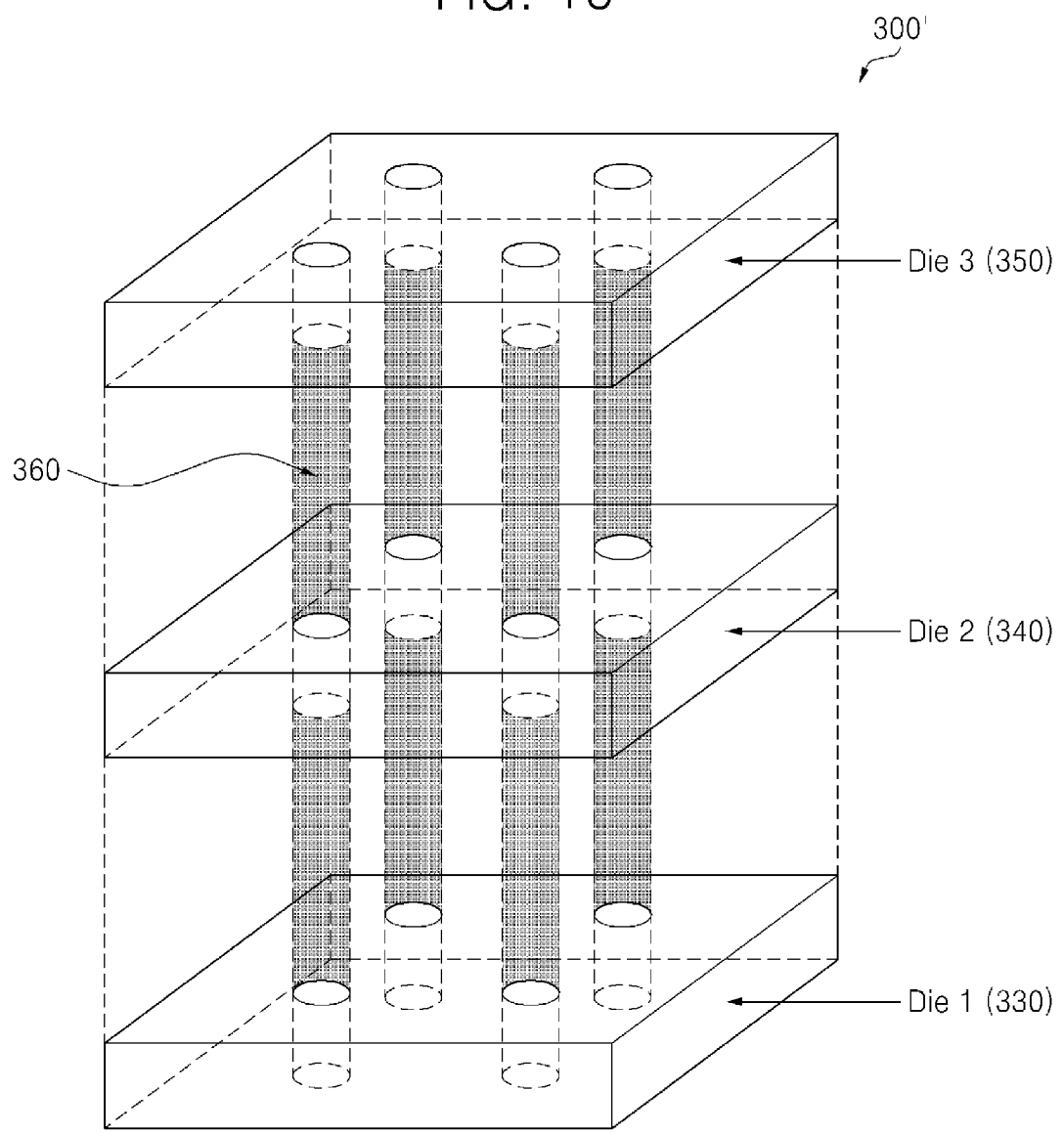
FIG. 15 is an exemplary three-dimensional (3D) conceptual diagram of a package including the memory device illustrated in FIG. 1 according to some embodiments.

FIG. 15 is a three-dimensional (3D) conceptual diagram of a package 300' including the memory device 100 illustrated in FIG. 1 according to some embodiments. Referring to FIGS. 1, 14, and 15, the package 300' includes a plurality of dies, i.e., the semiconductor devices 330 through 350 that are connected with one another through TSVs 360 in a stack structure.

Figure 16:
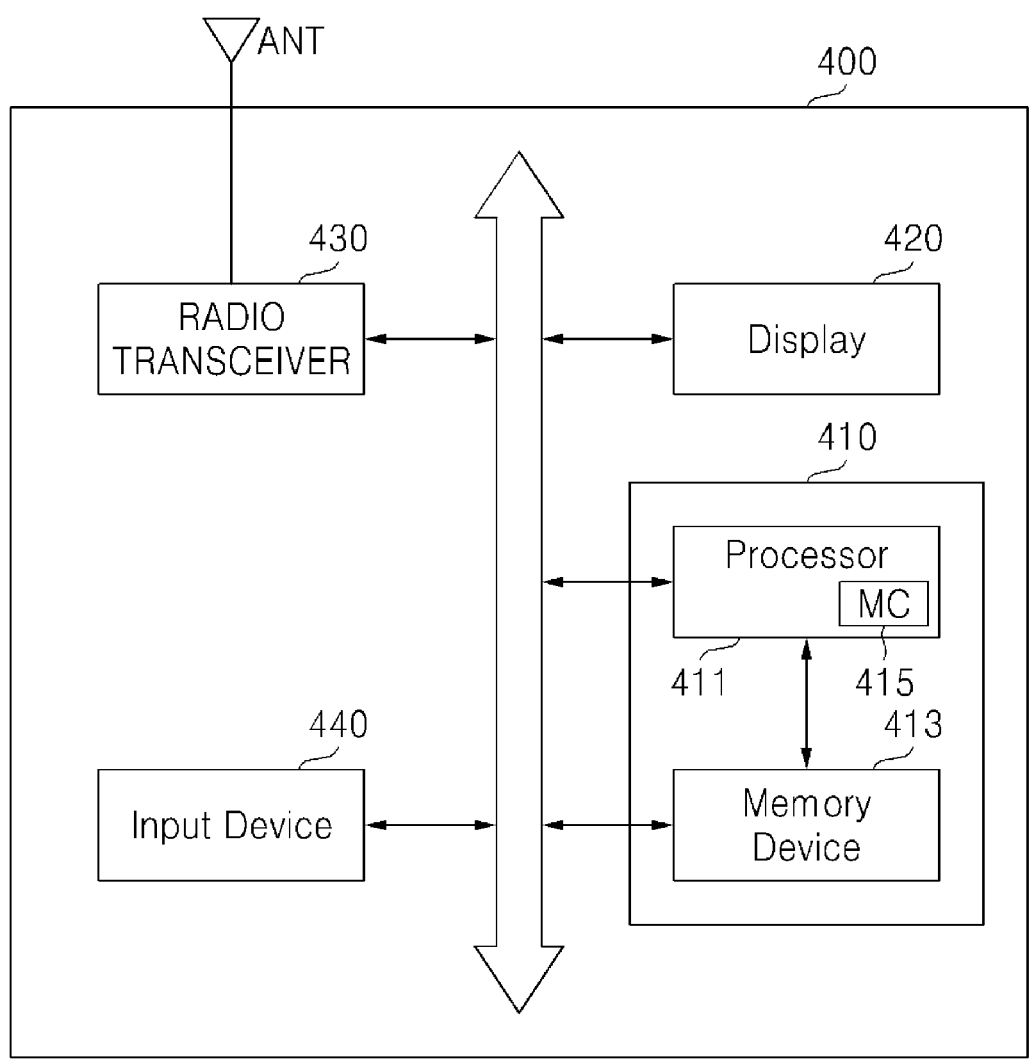
FIG. 16 is an exemplary diagram of a system including the memory device illustrated in FIG. 1 according to some embodiments.

FIG. 16 is a diagram of a system 400 including the memory device 100 illustrated in FIG. 1 according to some embodiments. Referring to FIG. 1 and FIGS. 14 through 16, the system 400 may be implemented as an electronic device or a portable device. The portable device may be a cellular phone, a smart phone, or a tablet personal computer (PC).

The system 400 includes a processor 411 and a memory device 413. The memory device 413 may be the memory device 100 illustrated in FIG. 1. The processor 411 and the memory device 413 may be packaged in the package 410. In this case, the package 410 may be mounted on a system board (not shown). The package 410 may be the package 300 illustrated in FIG. 14 or the package 300' illustrated in FIG. 15.

The processor 411 includes a memory controller 415 that can control a data processing operation, e.g., a write operation or a read operation, of the memory device 413. The memory controller 415 is controlled by the processor 411 that controls the overall operation of the system 400. Alternatively, the memory controller 415 may be connected between the processor 411 and the memory device 413.

Data stored in the memory device 413 may be displayed on a display 420 according to the control of the processor 411. A radio transceiver 430 may send or receive a radio signal through an antenna ANT. The radio transceiver 430 may convert a radio signal received through the antenna ANT into a signal that can be processed by the processor 411. Accordingly, the processor 411 may process the signal output from the radio transceiver 430 and store the processed signal in the memory device 413 or display the processed signal on the display 420.

The radio transceiver 430 may convert signals output from the processor 411 into radio signals and output the radio signals to an external device through the antenna ANT.

An input device 440 enables control signals for controlling the operation of the processor 411 or data to be processed by the processor 411 to be input to the system 400. The input device 440 may be implemented by a pointing device such as a touch pad or a computer mouse, a keypad, or a keyboard.

The processor 411 may control the operation of the display 420 to display data output from the memory device 413, radio signals output from the radio transceiver 430, or data output from the input device 440.

Figure 17:
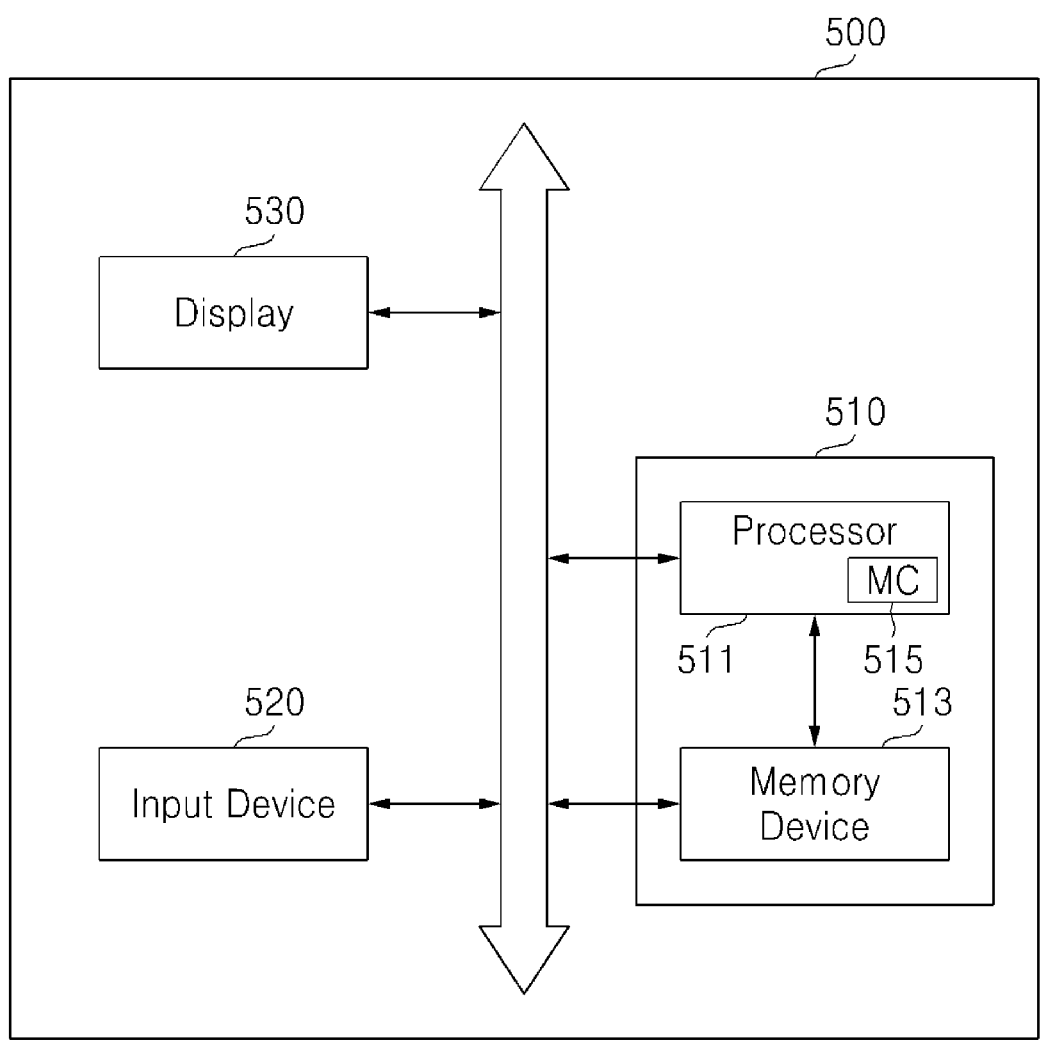
FIG. 17 is an exemplary diagram of a system including the memory device illustrated in FIG. 1 according to other embodiments.

FIG. 17 is a diagram of a system 500 including the memory device 100 illustrated in FIG. 1 according to other embodiments. Referring to FIGS. 1, 14, 15, and 17, the system 500 may be implemented as a PC, a tablet PC, a net-book, an e-reader, personal digital assistant (PDA), a portable multi-media player (PMP), an MP3 player, or an MP4 player.

The system 500 includes a processor 511 that controls the overall operation of the system 500 and a memory device 513. The memory device 513 may be the memory device 100 illustrated in FIG. 1. The processor 511 and the memory device 513 may be packaged in the package 510. The package 510 may be mounted on a system board (not shown). The package 510 may be the package 300 illustrated in FIG. 14 or the package 300' illustrated in FIG. 15.

The processor 511 may include a memory controller 515 controlling the operations of the memory device 513. The processor 511 may display data stored in the memory device 513 through a display 530 according to an input signal generated by an input device 520. The input device 520 may be implemented by a pointing device such as a touch pad or a computer mouse, a keypad, or a keyboard.

Figure 18:
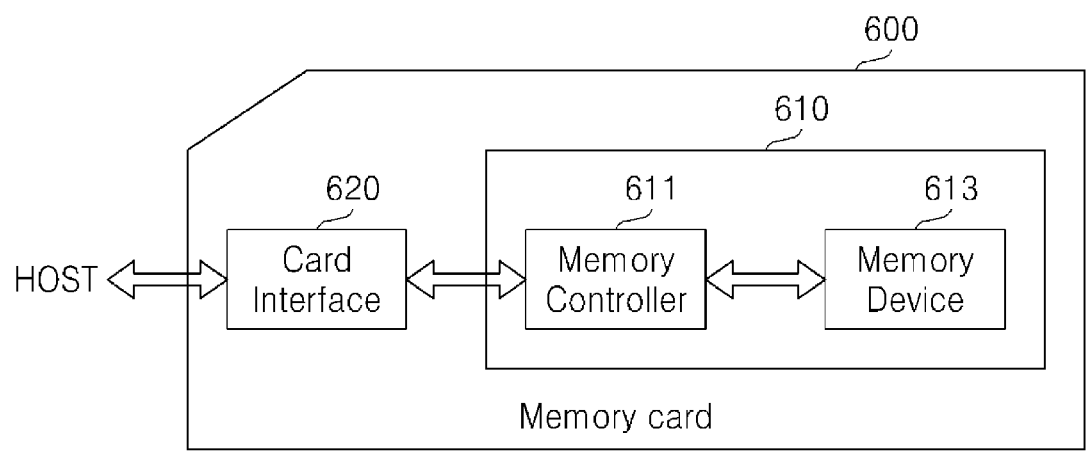
FIG. 18 is an exemplary diagram of a system including the memory device illustrated in FIG. 1 according to further embodiments.

FIG. 18 is a diagram of a system 600 including the memory device 100 illustrated in FIG. 1 according to further embodiments. Referring to FIGS. 1, 14, 15, and 18, the system 600 may be implemented as a memory card or a smart card.

The system 600 includes a memory device 613, a memory controller 611, and a card interface 620. The memory device 613 may be the memory device 100 illustrated in FIG. 1. The memory device 613 and the memory controller 611 may be packaged in a package 610. The package 610 may be mounted on a system board (not shown). The package 610 may be the package 300 illustrated in FIG. 14 or the package 300' illustrated in FIG. 15.

The memory controller 611 may control data exchange between the memory device 613 and the card interface 620. The card interface 620 may be a secure digital (SD) card interface or a multi-media card (MMC) interface, but the inventive concept is not restricted to the current embodiments. The card interface 620 may interface a host and the memory controller 611 for data exchange according to a protocol of the host.

When the system 600 is connected with the host such as a computer, a digital camera, a digital audio player, a cellular phone, a console video game hardware, or a digital set-top box, the host may communicate data with the memory device 613 through the card interface 620 and the memory controller 611.

Figure 19:
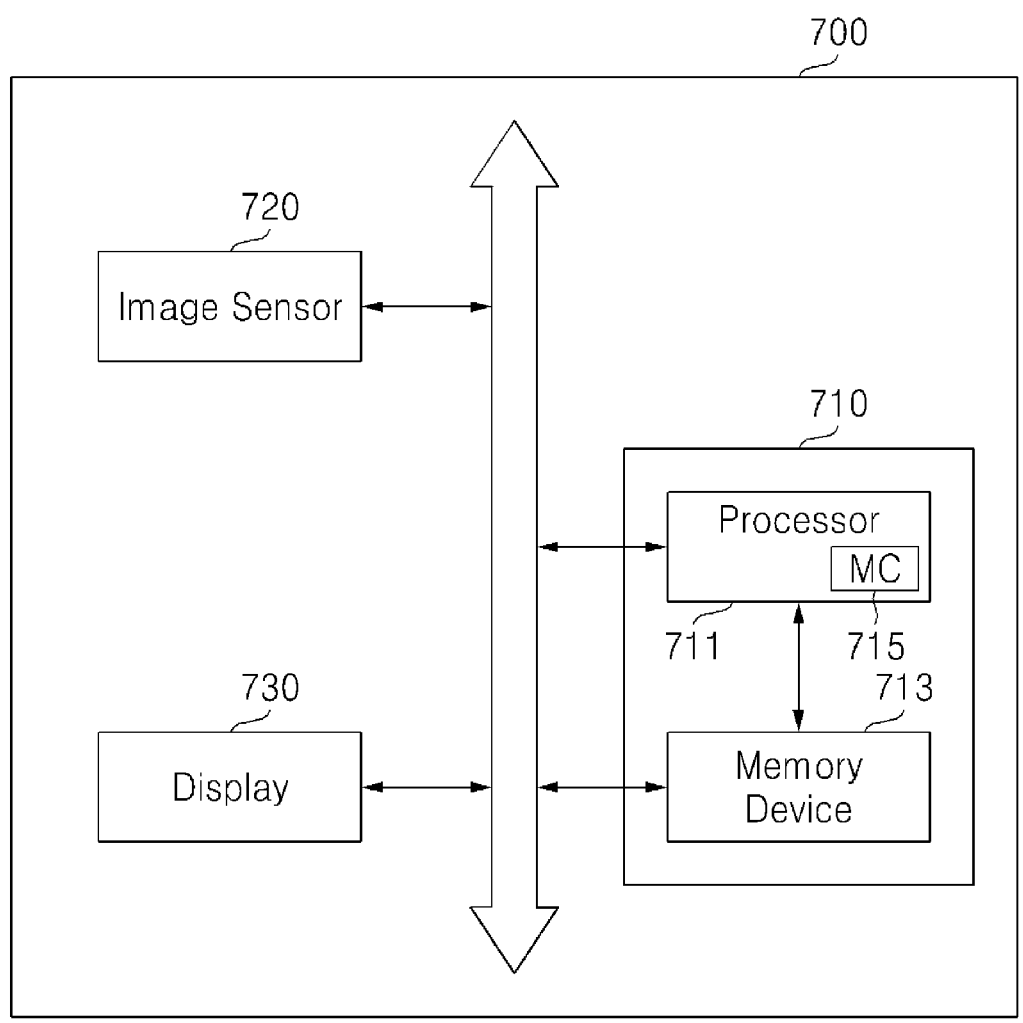
FIG. 19 is an exemplary diagram of a system including the memory device illustrated in FIG. 1 according to other embodiments.

FIG. 19 is a diagram of a system 700 including the memory device 100 illustrated in FIG. 1 according to other embodiments. Referring to FIGS. 1, 14, 15, and 19, the system 700 may be implemented as a digital camera or a portable device equipped with a digital camera.

The system 700 includes a processor 711 that controls the overall operation of the system 700 and a memory device 713. The memory device 713 may be the memory device 100 illustrated in FIG. 1. The processor 711 and the memory device 713 may be packaged in the package 710. The package 710 may be mounted on a system board (not shown). The package 710 may be the package 300 illustrated in FIG. 14 or the package 300' illustrated in FIG. 15.

An image sensor 720 included in the system 700 converts optical images into digital signals. The digital signals are stored in the memory device 713 or displayed through a display 730 under the control of the processor 711. The digital signals stored in the memory device 713 are displayed through the display 730 under the control of the processor 711.

Figure 20:
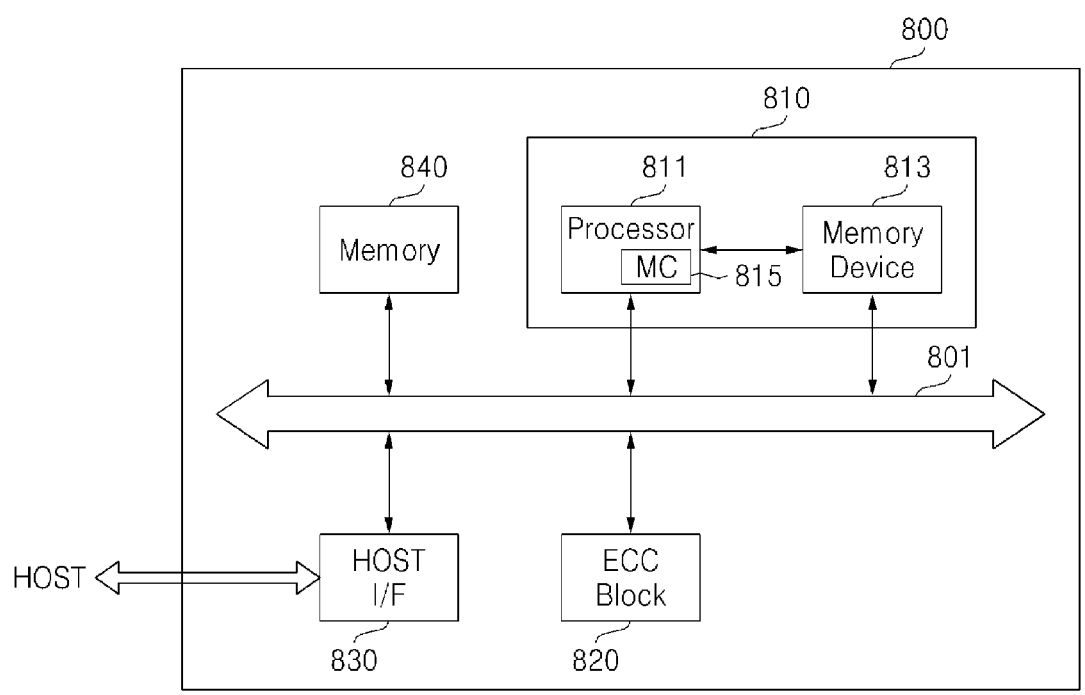
FIG. 20 is an exemplary diagram of a system including the memory device illustrated in FIG. 1 according to yet other embodiments.

FIG. 20 is a diagram of a system 800 including the memory device 100 illustrated in FIG. 1 according to yet other embodiments. Referring to FIGS. 1, 14, 15, and 20, the system 800 includes a memory device 813 and a processor 11 that controls the overall operation of the system 800. The memory device 813 may be the memory device 100 illustrated in FIG. 1.

The memory device 813 and the processor 811 may be packaged in the package 810. The package 810 may be mounted on a system board (not shown). The package 810 may be the package 300 illustrated in FIG. 14 or the package 300' illustrated in FIG. 15.

The processor 811 includes a memory controller 815 that controls the operations of the memory device 813.

The system 800 includes a memory 840 that may be used as an operation memory of the processor 811. The memory 840 may be implemented by non-volatile memory such as read-only memory (ROM) or flash memory. A host connected with the system 800 may communicate data with the memory device 813 through the processor 811 and a host interface 830. At this time, the memory controller 815 may function as a memory interface.

The system 800 may also include an error correction code (ECC) block 820. The ECC block 820 operating according to the control of the processor 811 detects and corrects an error in data read from the memory device 813 through the memory controller 815.

The processor 811 may control data communication among the ECC block 820, the host interface 830, and the memory 840 through a bus 801. The system 800 may be implemented as a universal serial bus (USB) memory drive or a memory stick.

Figure 21:
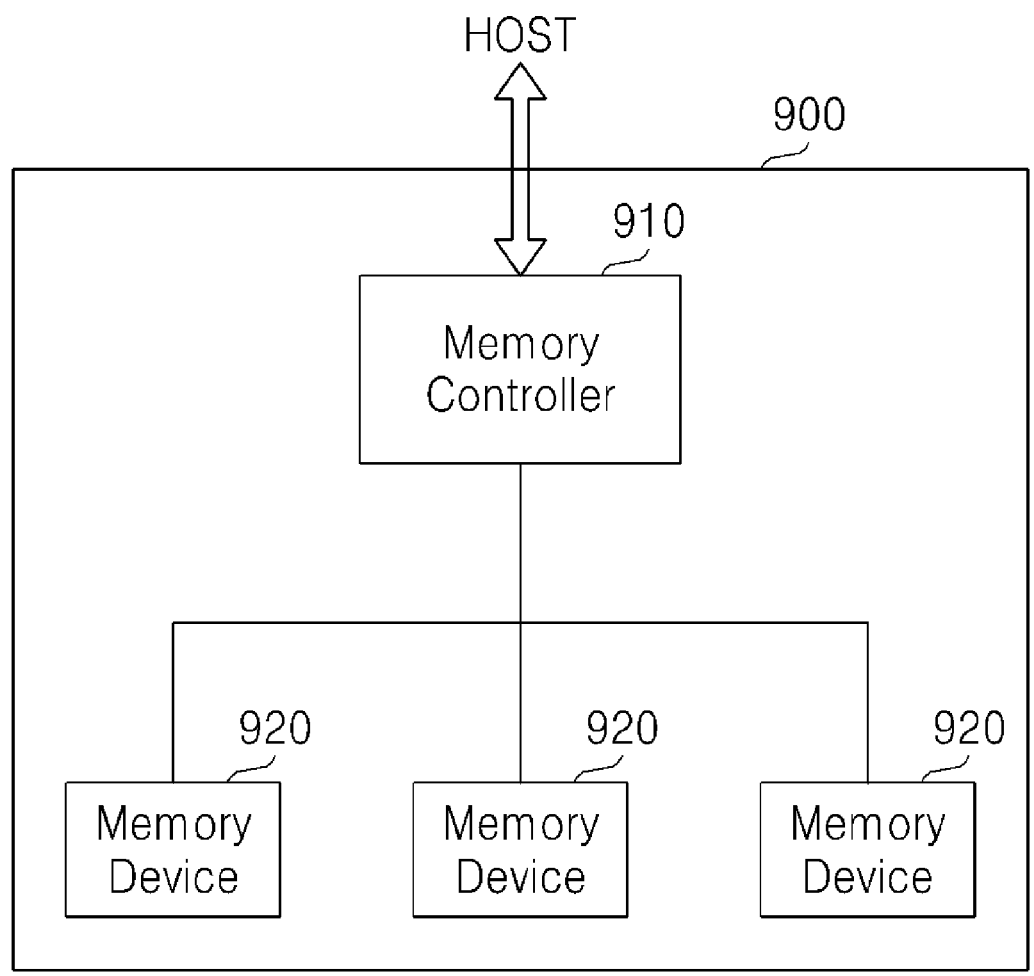
FIG. 21 is an exemplary diagram of a system including the memory device illustrated in FIG. 1 according to still other embodiments.

FIG. 21 is a diagram of a system 900 including the memory device 100 illustrated in FIG. 1 according to still other embodiments. Referring to FIGS. 1, 14, 15, and 21, the system 900 may be implemented as a data storage device such as a solid state drive (SSD). The system 900 may include a memory controller 910 that can control the data processing operation of a plurality of memory devices 920. The system 900 may be implemented by a memory module. Each of the memory devices 920 may be the memory device 100 illustrated in FIG. 1.

Figure 22:
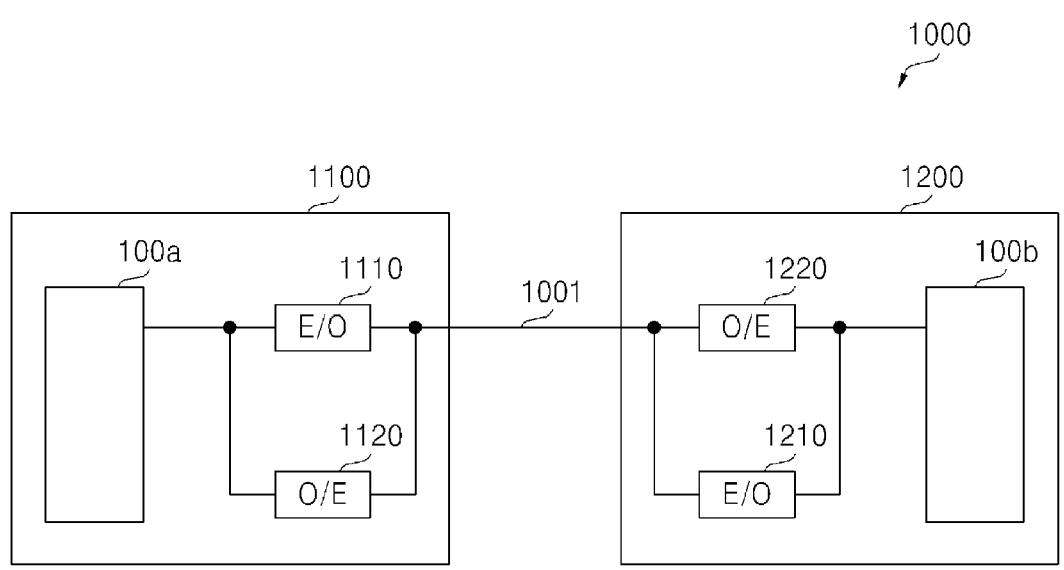
FIG. 22 is an exemplary diagram of a system including the memory device illustrated in FIG. 1 according to further embodiments.

FIG. 22 is a diagram of a system 1000 including the memory device 100 illustrated in FIG. 1 according to further embodiments. Referring to FIG. 22, the system 1000 may include a first system 1100 and a second system 1200, which communicate data with each other through a channel 1001.

The channel 1001 may be optical coupling means. The optical coupling means may be optical fiber, optical waveguide, or a medium transmitting an optical signal.

Referring to FIGS. 1 and 22, the first system 1100 may include a first memory device 100a and an electro-optic (E/O) conversion circuit 1110. The E/O conversion circuit 1110 may convert an electrical signal output from the first memory device 100a into an optical signal and output the optical signal to the second system 1200 through the optical coupling means 1001.

The second system 1200 includes an opto-electric (O/E) conversion circuit 1220 and a second memory device 100b. The O/E conversion circuit 1220 may convert an optical signal received through the optical coupling means 1001 into an electrical signal and transmit the electrical signal to the second memory device 100b.

The first system 1100 may also include an O/E conversion circuit 1120 and the second system 1200 may also include an E/O conversion circuit 1210.

When the second system 1200 transmit data to the first system 1100, the E/O conversion circuit 1210 may convert an electrical signal output from the second memory device 100b into an optical signal and output the optical signal to the first system 1100 through the optical coupling means 1001. The O/E conversion circuit 1120 may convert an optical signal received through the optical coupling means 1001 into an electrical signal and transmit the electrical signal to the first memory device 100a. The structure and the operations of the memory devices 100a and 100b are substantially the same as those of the memory device 100 illustrated in FIG. 1.

As described above, according to some embodiments, data stored in a fuse device is read in a predetermined order, so that the deterioration of the performance of a memory device including the fuse device can be prevented.

While the present disclosure has been particularly shown and described with reference to exemplary embodiments thereof, it will be understood by those of ordinary skill in the art that various changes in forms and details may be made therein without departing from the scope of the following claims.

What is claimed is:

1. A method for reading data stored in a fuse cell array of a memory device comprising a memory cell array, the method comprising:
    reading a first data of the fuse cell array, the first data including trimming information of level of voltage or level of current used for an operation of the memory device;
    reading a second data of the fuse call array, the second data including mode register set (MRS) information for setting of a mode register included in the memory device; and
    reading a third data of the fuse cell array, the third data including defective address information that indicates one or more defective cells of the memory cell array,
    wherein reading the first data is performed before reading the second data or reading the third data is performed.

2. The method of claim 1, wherein the defective address information includes row address information and column address information.

3. The method of claim 1, wherein the fuse cell array includes a plurality of anti-fuse cells.

4. The method of claim 1, wherein reading the second data and reading the third data are performed in parallel.

5. The method of claim 1, wherein reading the second data is performed before reading the third data is performed.

6. A fuse device of a memory device comprising a memory cell array, the fuse device comprising:
- a controller configured to generate a first command set and a second command set sequentially;
- a first access circuit configured to read trimming data including trimming level information of voltage or trimming level information of current used for an operation of the memory device in response to the first command set; and
- a second access circuit configured to read defective cell address data including address information of a defective cell in the memory cell array in response to the second command set,
- wherein the second access circuit is configured to read the defective cell address data after reading of the trimming data by the first access circuit.

7. The fuse device of claim 6, further comprising:
- a third access circuit configured to read mode register set data that includes setting information of a mode register set MRS in response to the third command set,
- wherein the controller is further configured to generate a third command set, and
- wherein the third access circuit is configured to read the mode register set data after reading of the trimming data by the first access circuit.

8. The fuse device of claim 6, further comprising:
- a sequence controller configured to generate a sequence signal; and
- a sequence circuit configured to sequentially output the trimming data and the defective cell address data in response to the sequence signal after receiving the trimming data and the defective cell address data.

9. The fuse device of claim 6, further comprising a transmission circuit,
- wherein the transmission circuit comprises:
- a sequence controller configured to generate a sequence signal;
- a serializing circuit configured to generate serial data by serializing the trimming data received from the first access circuit and the defective cell address data received from the second access circuit in response to the sequence signal; and
- a deserializing circuit configured to generate one or more parallel data by deserializing the serial data received from the serializing circuit.

10. A memory device comprising:
the fuse device of claim 6;
- a voltage generator configured to generate voltages in response to the trimming data of the fuse device;
- a row decoder configured to receive, from the fuse device, the defective cell address data related to a row address of each of the defective cells; and
- a column decoder configured to receive, from the fuse device, the defective cell address data related to a column address of each of the defective cells.

11. An electronic device comprising:
the memory device of claim 10; and
- a memory controller configured to control the memory device.

12. The electronic device of claim 11, further comprising:
- a sequence controller configured to generate a sequence signal; and
- a sequence circuit configured to sequentially output the trimming data and the defective cell address data in response to the sequence signal after receiving the trimming data and the defective cell address data.

13. The electronic device of claim 11, further comprising a transmission circuit,
- wherein the transmission circuit comprises:
- a sequence controller configured to generate a sequence signal;
- a serializing circuit configured to generate serial data by serializing the trimming data received from the first access circuit and the defective cell address data received from the second access circuit in response to the sequence signal; and
- a deserializing circuit configured to generate one or more parallel data by deserializing the serial data received from the serializing circuit.

* * * * *